(12) United States Patent
Cordaro et al.

(10) Patent No.: US 12,101,611 B2
(45) Date of Patent: Sep. 24, 2024

(54) DIGITAL PDM MICROPHONE INTERFACE

(71) Applicant: SYNTIANT, Irvine, CA (US)

(72) Inventors: Joseph Cordaro, Huntington Beach, CA (US); David Garrett, Tustin, CA (US)

(73) Assignee: SYNTIANT, Irvine, CA (US)

( * ) Notice: Subject to any disclaimer, the term of this patent is extended or adjusted under 35 U.S.C. 154(b) by 162 days.

(21) Appl. No.: 17/874,210

(22) Filed: Jul. 26, 2022

(65) Prior Publication Data
US 2024/0040307 A1 Feb. 1, 2024

(51) Int. Cl.
  *H04R 3/00* (2006.01)
  *G06F 1/08* (2006.01)
  (Continued)

(52) U.S. Cl.
  CPC .............. *H04R 3/005* (2013.01); *G06F 1/08* (2013.01); *G06F 1/12* (2013.01); *H04R 19/04* (2013.01);
  (Continued)

(58) Field of Classification Search
  None
  See application file for complete search history.

(56) References Cited

U.S. PATENT DOCUMENTS

| | | | | |
|---|---|---|---|---|
| 5,488,709 A | * | 1/1996 | Chan | G06F 12/0879 711/149 |
| 2008/0189512 A1 | * | 8/2008 | Hansen | G06F 9/30014 712/E9.001 |
| 2008/0313485 A1 | * | 12/2008 | Frank | H03K 3/35625 713/401 |

* cited by examiner

*Primary Examiner* — Duc Nguyen
*Assistant Examiner* — Assad Mohammed
(74) *Attorney, Agent, or Firm* — Rutan & Tucker LLP; Hani Z. Sayed; Ravi Mohan

(57) ABSTRACT

A clocking technique for reducing the power of PDM microphones in dual microphone systems is disclosed. A clock for a conventional PDM microphone (PDMCLK) is provided by another source. PDM microphones send serial data (PDMDAT) on the rising ("Right") or falling ("Left") edge of the PDMCLK clock, depending on how the microphone is configured. In a dual PDM microphone configuration, the microphones alternate sending data on the rising edges (transitions to logic-1) and falling edges (transitions to logic-0) of PDMCLK. Typically, Complementary Metal-Oxide-Semiconductor (CMOS) logic is used to transmit or drive the clock signal to the microphones. CMOS drivers consume power primarily when they transition from a logic-0 to a logic-1 or from a logic-1 to a logic-0. Thus, a free-running clock signal will produce the highest CMOS power consumption. In a dual PDM microphone system, it is desirable to operate in a low power mode with a single microphone at times and to operate with the full functionality (and power consumption) of both microphones at other times. In a conventional system, both PDM microphones share both the PDMDAT and PDMCLK signal lines. Thus both microphones must be clocked even if only one is being used. This wastes power in both the PDMCLK output buffer (driving both loads even if one is not being used) as well as in the unused microphone (where all of the clock circuits are active and switching). A novel PDM microphone interface is disclosed that provides a three signal interface comprising a separate PDMCLK signal to each microphone while maintaining a single common PDMDAT line.

20 Claims, 7 Drawing Sheets

(51) Int. Cl.
   *G06F 1/12* (2006.01)
   *H04R 19/04* (2006.01)
   *H03K 3/037* (2006.01)
(52) U.S. Cl.
   CPC ........ *H03K 3/037* (2013.01); *H04R 2201/003* (2013.01)

DIGITAL PDM MICROPHONE INTERFACE

FIELD

The present disclosure relates to Pulse Density Modulation (PDM) Microphone interfacing. More particularly, the present disclosure relates to efficient low power signaling in dual PDM microphone systems.

RELATED APPLICATION

This application is related to co-pending application U.S. patent application Ser. No. 17/874,236 filed on Jul. 26, 2022, having common ownership and is included herein by reference in its entirety.

BACKGROUND

Microphones are commonly made using silicon microelectromechanical system (MEMS) technology. MEMS microphones are often used as transducers for capturing sound in digital systems, including, for example, cellular phones and laptop computers. MEMS microphones can be analog or digital, converting the sound waves into a discrete, digital signal inside the microphone enclosure.

In prior designs, the Pulse Density Modulation (PDM) Microphone power consumption was a small fraction of the total system power because the applications processor of the device which processed the PDM audio, such as a cellphone or earbud, consumed much more power. The advent of low-power wearable always-on neural chips to listen to and process voice means that the device processing the microphone data consumes substantially less power than before.

Digital MEMS microphones utilize high-order sigma-delta modulation to provide noise shaping in the analog to digital conversion (ADC) process and a modulation technique called Pulse Density Modulation (PDM), where a single data line (PDMDAT) is used to convey the digital information from the microphone source to a device, such as a Wake Word detection IC, or cellular phone, which processes the audio. A clock for the PDM microphone (PDMCLK) is provided by another source, such as a Wake Word detection IC or host processor. PDM microphones send data on the rising ("Right") or falling ("Left") edge of the PDMCLK clock, depending on how the microphone is configured.

Sound waves have a tremendous dynamic range. This means quiet sounds, when converted to a continuous electrical signal, are represented by an extremely small voltage compared to high acoustic energy events. For this reason, digital MEMS microphones are often preferred over analog microphones in modern devices because analog microphones are very sensitive to noise.

Digital MEMS microphones have higher power consumption than analog MEMS microphones due in large part to the switching of the digital inputs and outputs. Because of the increase in power consumption, an analog microphone is frequently used to save power. Often, analog microphones and digital microphones are combined in a system, raising system complexity and cost. A designer, to avoid the complications of using analog microphones, may opt to use digital microphones in a system. A way to avoid dissipating a large fraction of the total system power in the digital microphone interface is highly desirable.

BRIEF DESCRIPTION OF DRAWINGS

The above and other aspects, features, and advantages of several embodiments of the present disclosure will be more apparent from the following description is presented in conjunction with the following several figures of the drawings.

Figure 1:
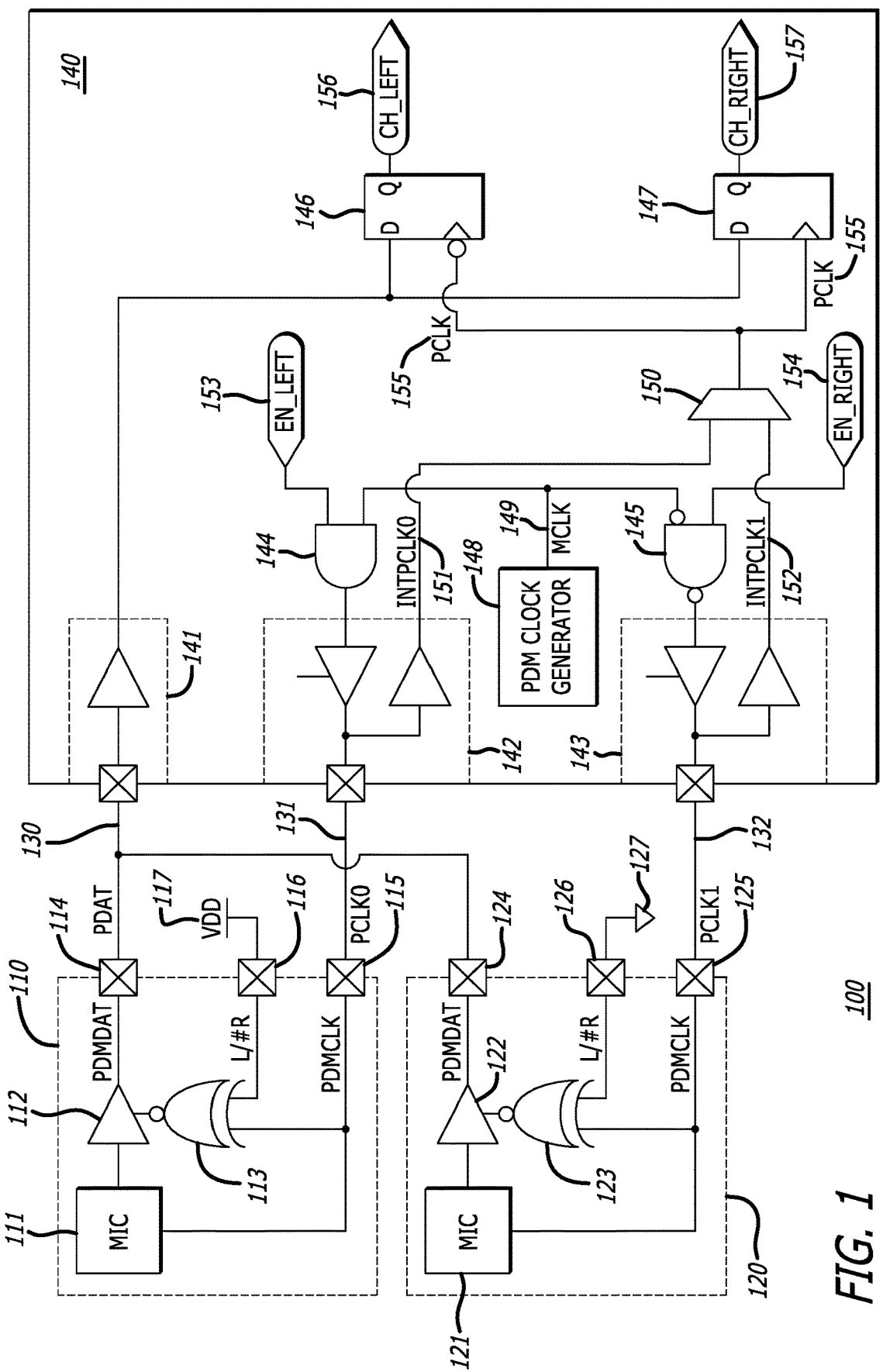
FIG. 1 is a conceptual block diagram of a system employing dual PDM microphones in accordance with an embodiment of the disclosure.

Corresponding reference characters indicate corresponding components throughout the several figures of the drawings. Elements in the several figures are illustrated for simplicity and clarity and have not necessarily been drawn to scale. For example, the dimensions of some of the elements in the figures might be emphasized relative to other elements to facilitate understanding of the various presently disclosed embodiments. In addition, common but well-understood elements that are useful or necessary in a commercially feasible embodiment are often not depicted in order to facilitate a less obstructed view of these various embodiments of the present disclosure.

DETAILED DESCRIPTION

In response to the situations described above, a clocking technique for reducing the power of PDM microphones in dual microphone systems is disclosed. Digital MEMS microphones utilize high-order sigma-delta modulation to provide noise shaping in the analog to digital conversion (ADC) process and a modulation technique called Pulse Density Modulation (PDM), where a single data line (PDMDAT) is used to convey the digital information from the microphone source to a device, such as a Wake Word detection IC, or cellular phone, which processes the audio. A clock for a PDM microphone (PDMCLK) is provided by another source, such as a Wake Word recognition chip, the host processor, or some other device. PDM microphones send data on the rising ("Right") or falling ("Left") edge of the PDMCLK clock, depending on how the microphone is configured. In a conventional dual PDM microphone configuration, the microphones alternate sending data on the rising edges (transitions to logic-1) and falling edges (transitions to logic-0) of PDMCLK.

Typically, Complementary Metal-Oxide-Semiconductor (CMOS) logic is used to transmit or drive the clock signal to the microphones. CMOS drivers consume power primarily when they transition from a logic-0 to a logic-1 or from a logic-1 to a logic-0. Thus, a free-running clock signal will produce the highest CMOS power consumption.

In an embodiment employing a dual PDM microphone system, it is desirable to operate in a low power mode with a single microphone at times and operate with the full functionality (and power consumption) of both microphones at other times. In a conventional system, both PDM microphones share both the PDMDAT and PDMCLK signal lines. Thus both microphones must be clocked even if only one is being used. This wastes power in both the PDMCLK output buffer (driving both loads even if one is not being used) as well as in the unused microphone (where all of the clock circuits are active and switching). In various embodiments, a novel PDM microphone interface is disclosed that provides a three signal interface comprising a separate PDMCLK signal to each microphone while maintaining a single common PDMDAT line. No change is required for either of the PDM microphones for use in these embodiments.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "function," "module," "apparatus," or "system." Furthermore, aspects of the present disclosure may take the form of a computer program product embodied in one or more non-transitory computer-readable storage media storing computer-readable and/or executable program code. Many of the functional units described in this specification have been labeled as functions, in order to emphasize their implementation independence more particularly. For example, a function may be implemented as a hardware circuit comprising custom VLSI circuits or gate arrays, off-the-shelf semiconductors such as logic chips, transistors, or other discrete components. A function may also be implemented in programmable hardware devices such as via field programmable gate arrays, programmable array logic, programmable logic devices, or the like.

Functions may also be implemented at least partially in software for execution by various types of processors. An identified function of executable code may, for instance, comprise one or more physical or logical blocks of computer instructions that may, for instance, be organized as an object, procedure, or function. Nevertheless, the executables of an identified function need not be physically located together but may comprise disparate instructions stored in different locations which, when joined logically together, comprise the function and achieve the stated purpose for the function.

Indeed, a function of executable code may include a single instruction, or many instructions, and may even be distributed over several different code segments, among different programs, across several storage devices, or the like. Where a function or portions of a function are implemented in software, the software portions may be stored on one or more computer-readable and/or executable storage media. Any combination of one or more computer-readable storage media may be utilized. A computer-readable storage medium may include, for example, but is not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object-oriented programming language such as Python, Java, Smalltalk, C++, C #, Objective C, or the like, conventional procedural programming languages, such as the "C" programming language, scripting programming languages, assembly languages, and/or other similar programming languages. The program code may execute partly or entirely on one or more of a user's computers and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices in electrical communication with one or more other components through electrical lines of a printed circuit board (PCB) or the like. Each of the functions and/or modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as a field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices in electrical communication with one or more other components through electrical lines of a printed circuit board (PCB) or the like. Each of the functions and/or modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to," unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Further, as used herein, reference to reading, writing, loading, storing, buffering, and/or transferring data can include the entirety of the data, a portion of the data, a set of the data, and/or a subset of the data. Likewise, reference to reading, writing, loading, storing, buffering, and/or transferring non-host data can include the entirety of the non-host data, a portion of the non-host data, a set of the non-host data, and/or a subset of the non-host data.

Lastly, the terms "or" and "and/or" as used herein are to be interpreted as inclusive or meaning any one or any combination. Therefore, "A, B or C" or "A, B and/or C" mean "any of the following: A; B; C; A and B; A and C; B and C; A, B and C." An exception to this definition will occur only when a combination of elements, functions, steps, or acts are in some way inherently mutually exclusive.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

Referring to FIG. 1, a conceptual block diagram of a system employing dual PDM microphones in accordance with an embodiment of the disclosure is shown. In system 100 may comprise first PDM microphone 110, second PDM microphone 120, and controller 140. First PDM microphone 110 may comprise a mic element 111 that may be coupled to an output buffer 112, which may be further coupled to PDMDAT output pad 114. Mic element 111 may comprise an analog transducer (not shown—typically a MEMS integrated circuit) and an analog-to-digital converter (not shown—typically a sigma-delta modulator that produces the PDM bitstream to be output on PDMDAT output pad 114). There are many different embodiments for mic element 111 known in the art, so more detail is omitted to avoid overcomplicating the disclosure.

Output buffer 112 may have a data input that may take the PDM bitstream from mic element 111, may convert it to the appropriate voltage levels at a data output, and may transmit the bitstream externally via PDMDAT output pad 114. Output buffer may have an enable input coupled to the data output of an exclusive-NOR (XNOR) gate 113. XNOR gate 113 may have a first data input that may be coupled to PDMCLK clock input pad 115 and a second data input coupled that may be coupled to L/#R control input pad 116. The L/#R (left/not right) control input pad 116 may determine if the PDM microphone 110 is part of the left acoustic channel (logic-1) or the right acoustic channel (logic-0). Typically, this may be set when the microphone is configured using a jumper and may not change during operation, and XNOR gate 113 may determine the polarity of the enable signal presented to the enable input of In system 100, L/#R control input pad 116 may be coupled to the positive voltage VDD 117 (logic-1) making it the "left microphone."

PDMCLK clock input pad 115 may provide a clock signal to the various synchronous elements internal to PDM microphone and to mic element 111 in particular. The signal on PDMCLK clock input pad 115 may also enable and disable the data output of output buffer 112. Thus, for half of the PDMCLK signal period the bitstream from mic element 111 may appear at PDMDAT output pad 114, and for the other half of the PDMCLK signal period output driver 122 may present high-impedance to PDMDAT output pad 114. This may allow two standard PDM microphones to share a common two-pin interface (PDMCLK and PDMDAT) and alternate sharing the PDMDAT signal on opposite phases of PDMCLK.

Second PDM microphone 120 may comprise a mic element 121 that may be coupled to an output buffer 122, which may be further coupled to PDMDAT output pad 124. Mic element 121 may comprise an analog transducer (not shown—typically a MEMS integrated circuit) and an analog-to-digital converter (not shown—typically a sigma-delta modulator that produces the PDM bitstream to be output on PDMDAT output pad 114). There are many different embodiments for mic element 121 known in the art, so more detail is omitted to avoid overcomplicating the disclosure.

Output buffer 122 may have a data input that may take the PDM bitstream from mic element 121, may convert it to the appropriate voltage levels at a data output, and may transmit the bitstream externally via PDMDAT output pad 124. Output buffer may have an enable input coupled to the data output of an exclusive-NOR (XNOR) gate 123. XNOR gate 123 may have a first data input that may be coupled to PDMCLK clock input pad 115 and a second data input coupled that may be coupled to L/#R control input pad 126. The L/#R (left/not right) control input pad 126 may determine if the PDM microphone 110 is part of the left acoustic channel (logic-1) or the right acoustic channel (logic-0). Typically, this may be set when the microphone is configured using a jumper and may not change during operation, and XNOR gate 123 may determine the polarity of the enable signal presented to the enable input of In system 100, L/#R control input pad 126 may be coupled to ground 127 (logic-0) making it the "right microphone."

PDMCLK clock input pad 125 may provide a clock signal to the various synchronous elements internal to PDM microphone and to mic element 121 in particular. The signal on PDMCLK clock input pad 125 may also enable and disable the data output of output buffer 122. Thus, for half of the PDMCLK signal period the bitstream from mic element 121 may appear at PDMDAT output pad 124, and for the other half of the PDMCLK signal period output driver 122 may present high-impedance to PDMDAT output pad 124. This may allow two standard PDM microphones to share a common two-pin interface (PDMCLK and PDMDAT) and alternate sharing the PDMDAT signal on opposite phases of PDMCLK.

External PDAT signal 130 may be coupled to PDMDAT output pad 114, PDMDAT output pad 124, and PDAT data input buffer 141 of controller 140. External PCLK0 signal 131 may be coupled to clock output buffer 142 of controller 140. External PCLK1 signal 132 may be coupled to clock output buffer 143 of controller 140. Clock output buffers 142 and 143 may be input/output buffers always operated in output mode to generate external PCLK0 131 and external PCLK1 132, respectively. The input buffer functions are used to generate internal clock signals INTPCLK0 151 and INTPCLK1 152, respectively. Unlike a conventional PDM microphone interface that has two signals (PDMDAT and PDMCLK), the embodiment shown in FIG. 1 has a three-signal interface (PDAT, PCLK0, and PCLK1). The functionality of the two clock signals in the interface will be described below.

Controller 140 may comprise PDM clock generator 148, which may generate a master clock signal MCLK 149 which may comprise a series of clock pulses. Each clock pulse may comprise a first clock phase following a first edge and a second clock phase following a second active edge. MCLK 149 may be generated from an oscillator or some other circuit, either internal or external to controller 140. The other clocks in this embodiment may be derived from MCLK 149, either delayed and/or with a parity inversion.

AND gate 144 may have a first data input coupled to signal EN_LEFT 153, a second data input coupled to master clock signal MCLK 149, and an output coupled to clock output buffer 142. When signal EN_LEFT 153 is active (logic-1), the master clock signal MCLK 149 is used to generate external PCLK0 131 as well as INTPCLK0 151. When signal EN_LEFT 153 is inactive (logic-0), external PCLK0 131, as well as INTPCLK0 151, are both driven to logic-0. External PCLK0 131 driven to logic-0 and control pad L/#R 116 coupled to logic-1 causes XNOR gate 113 to drive the enable input of output buffer 112 to logic-0, presenting high impedance to the external PDAT signal 130. This may allow the right microphone to transmit PDAT signal 130 to controller 140 without conflict when the left microphone clock PCLK0 131 is inactive.

AND gate 145 may have a first data input coupled to signal EN_RIGHT 154, an inverted second data input coupled to master clock signal MCLK 149, and an inverted output coupled to clock output buffer 143. When signal EN_RIGHT 154 is active (logic-1), the master clock signal MCLK 149 (twice inverted) is used to generate external PCLK1 132 as well as INTPCLK1 152. When signal EN_LEFT 153 is inactive (logic-0), external PCLK0 131, as well as INTPCLK0 151, are both driven to logic-1. External PCLK1 132 driven to logic-1 and control pad L/#R 126 coupled to logic-0 causes XNOR gate 123 to drive the enable input of output buffer 122 to logic-0, presenting high impedance to the external PDAT signal 130. This may allow the left microphone to transmit PDAT signal 130 to controller 140 without conflict when the left microphone clock PCLK0 132 is inactive.

Multiplexer 150 has a first data input coupled to INTPCLK0 151, a second data input coupled to INTPCLK1 152, and a data output coupled to internal PCLK signal 155. Internal PCLK signal 155 is coupled to an inverted clock input of flip/flop 146 and a non-inverted clock input of flip/flop 147. The flip/flops 146 and 147 are used to extract the left channel acoustic data CH_LEFT 156 and the right channel acoustic data CH RIGHT 157, respectively, from the PDAT 130 bitstream. In some embodiments, multiplexer 150 is a glitchless clock multiplexer.

The three-signal interface illustrated in FIG. 1 may allow each PDM microphone to operate independently when the other microphone is powered down with its clock disabled. This would not be possible with the conventional two-signal interface where the left and right microphones must share a single clock line. Further, no modification may be needed to the standard two-signal PDM microphone itself (beyond configuring the polarity of the L/#R control pin) as it may operate normally in both single and dual microphone modes, unaware of the presence or absence of the other microphone.

Figure 2:
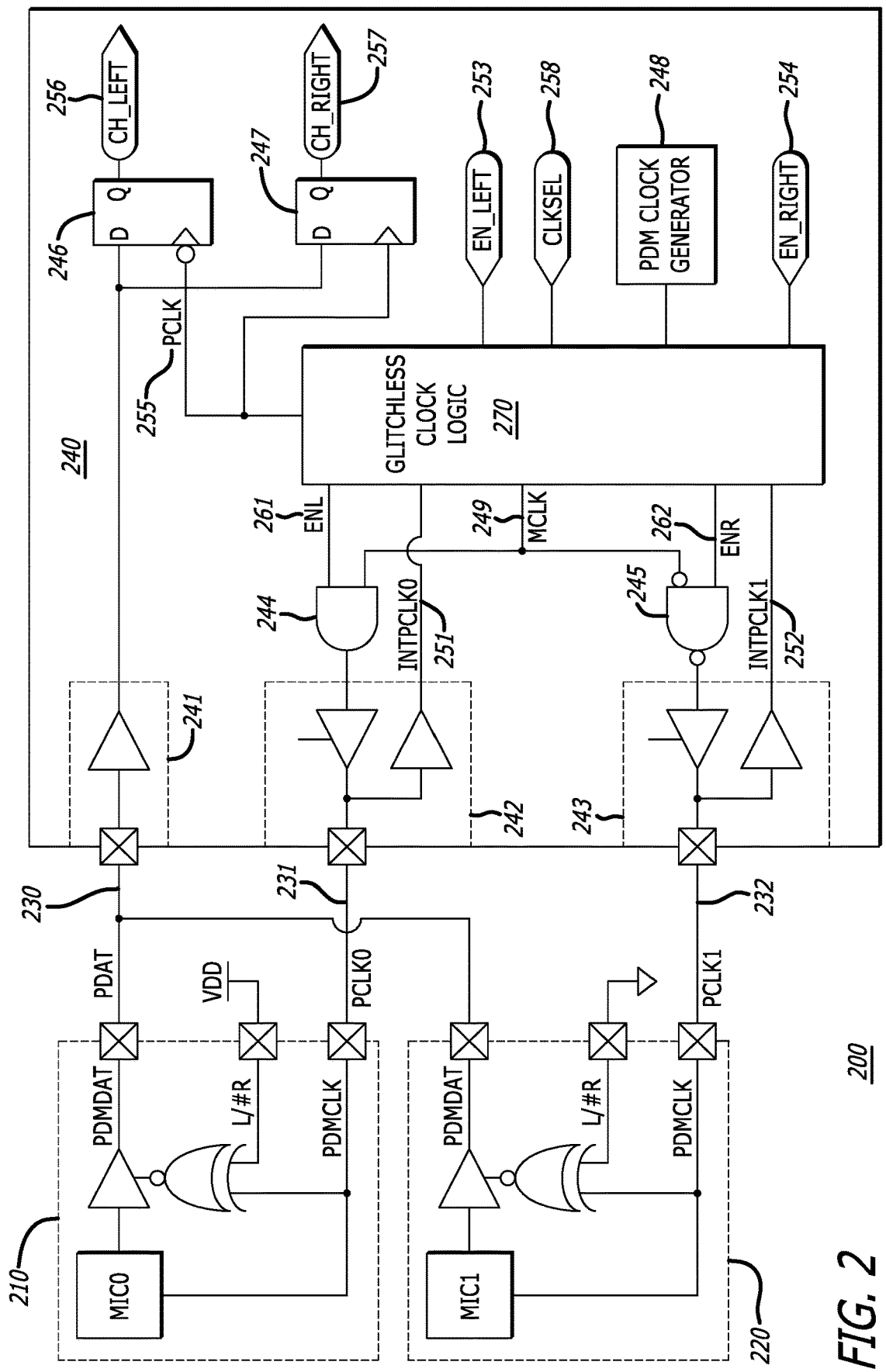
FIG. 2 is a schematic block diagram of a system employing dual PDM microphones in accordance with an embodiment of the disclosure.

Referring to FIG. 2, a schematic block diagram of a system employing dual PDM microphones in accordance with an embodiment of the disclosure is shown. System 200 may comprise first and second PDM microphones 210 and 220, respectively. Microphones 210 and 220 may operate in a manner similar to microphones 110 and 120 of FIG. 1. Microphone 210 may be configured as the left microphone with its L/#R input coupled to VDD (logic-1), and microphone 220 may be configured as the right microphone with its L/#R input coupled to ground (logic-0).

PDM microphones 210 and 220 may be coupled to controller 240 using a three-signal interface comprising PDAT 230, PCLK0 231, and PCLK1 232. The signals PDAT 230, PCLK0 231, and PCLK1 232 are coupled to data input 241, clock output 242, and clock output 243, respectively. Data input 241 may be coupled to the data inputs (D) of flip/flops 246 and 247, whose data outputs (Q) may be coupled to CH_LEFT 256 and CH RIGHT 257, respectively. PCLK 255 may be output from glitchless clock logic 270 and coupled to an inverted clock input on flip/flop 246 and a non-inverted clock input on flip/flop 247. Flip/flops 246 and 247 may be used to separate out the left acoustic channel data and the right channel acoustic data from the PDAT 230 bitstream as CH_LEFT 256 and CH RIGHT 257, respectively.

Glitchless clock logic 270 may be responsible for the timing of the various signals in system 200, both internal and external to controller 240. Glitchless clock logic 270 may take a clock generated by PDM clock generator 248 and produce correctly timed signals MCLK 249, ENL 261, and ENR 262 for generating PCLK0 231 and PCLK1 232. PCLK0 may be driven by clock output 242 and may, in turn, drive INTPCLK0 251 back to glitchless clock logic 270. Similarly, PCLK1 may be driven by clock output 243 and may, in turn, drive INTPCLK1 252 back to glitchless clock logic 270.

MCLK 249 and ENL 261 are timed to arrive at AND gate 244 to generate PCLK0 231 without any glitching. When the left enable signal ENL 261 is active (logic-1), then PCLK0 231 may drive clock left microphone 210 with a delayed version of MCLK 249. When ENL 261 is inactive (logic-0), PCLK0 231 may be driven to logic-0 to disable the output drive of left microphone 210 on the PDAT 230 signal.

Similarly, MCLK 249 and ENR 262 are timed to arrive at AND gate 245 to generate PCLK1 232 without any glitching. When the right enable signal ENR 262 is active (logic-1), then PCLK1 232 may drive clock left microphone 210 with a delayed version of MCLK 249. When ENR 262 is inactive (logic-0), PCLK1 232 may be driven to logic-1 to disable the output drive of right microphone 220 on the PDAT 230 signal.

Glitchless clock logic 270 may receive CLKSEL 258, INTPCLK0 251, and INTPCLK1 252 as inputs. CLKSEL 258 may determine the source of PCLK 255 from either INTPCLK0 251 or INTPCLK1 252. In certain embodiments, the glitchless clock logic 270 may also receive an EN_LEFT 253 or EN_RIGHT 254 input signal. This may ensure that in a mode where one microphone is always on and the other is occasionally turned off that the PCLK0/1 clock for the always-on microphone may be used to correctly extract the acoustic data from the bitstream on PDAT 230.

Figure 3:
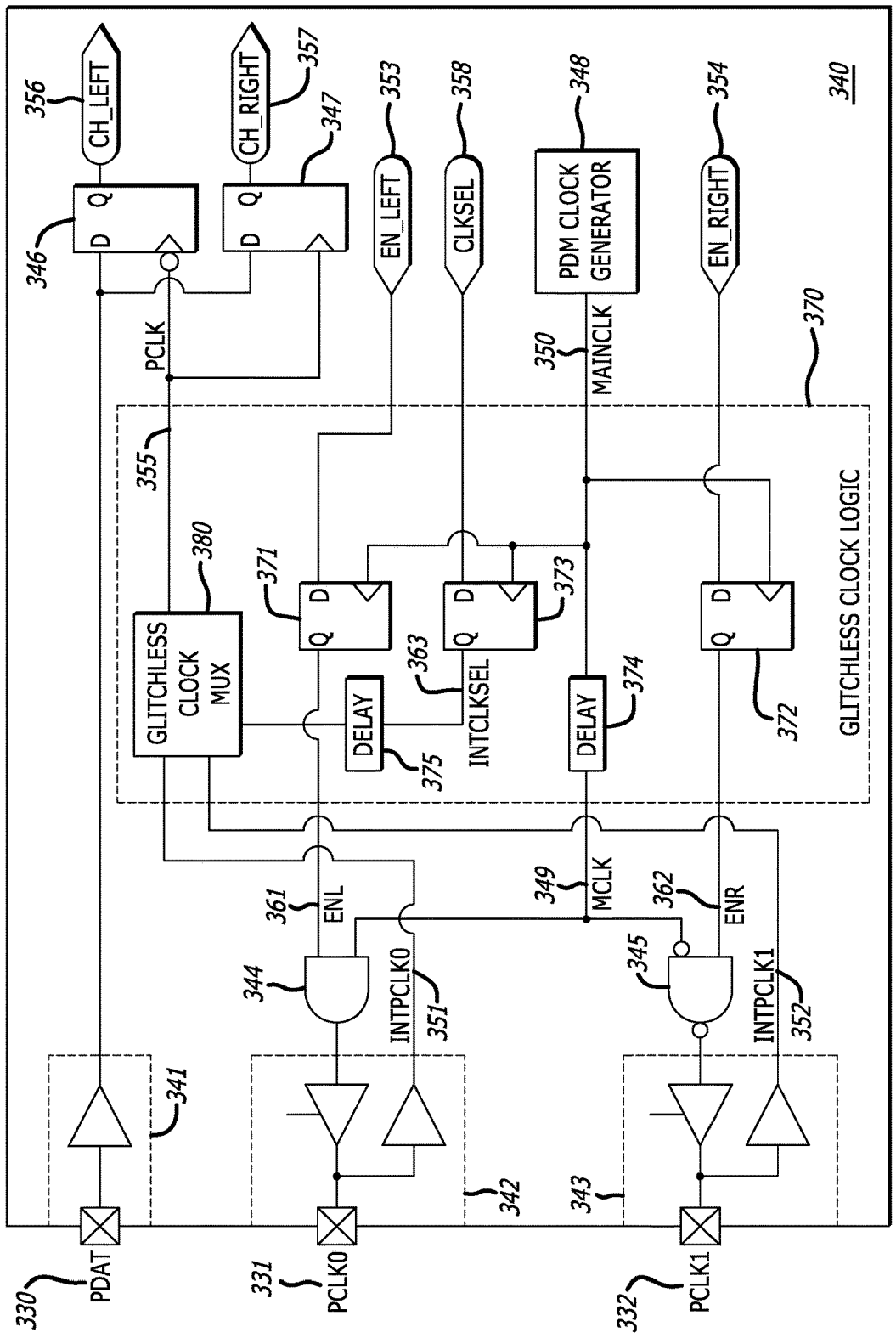
FIG. 3 is a schematic block diagram of a PDM controller configured for employing dual PDM microphones in accordance with an embodiment of the disclosure.

Referring to FIG. 3, a schematic block diagram of a PDM controller configured for employing dual PDM microphones in accordance with an embodiment of the disclosure is shown. Controller 340 may comprise PDAT input 341, PCLK0 output 342, and PCLK1 output 343 coupled to the external signals PDAT 330, PCLK0 331, and PCLK1 332, respectively. PDAT input 341 may be configured to be coupled to the PDMDAT outputs of two PDM microphones (not shown) in a manner similar to the embodiment discussed in conjunction with FIG. 2. PCLK0 output 342 may be configured to be coupled via signal PCLK0 331 to the PDMCLK input of the first PDM microphone (not shown), and PCLK1 output 343 may be configured to be coupled via signal PCLK0 331 to the PDMCLK input of the second PDM microphone (not shown).

PDAT input 341 may be coupled to the data inputs (D) of flip/flops 346 and 347. The data outputs (Q) of flip/flops 346 and 347 may be coupled to signal CH_LEFT 356 and CH RIGHT 357. Clock signal PCLK 355 may be coupled to the clock inputs of flip/flops 346 and 347. Flip/flop 346 may have an inverted clock input, while flip/flop 347 has a non-inverted clock input. Clocking flip/flops 346 and 347 on opposite phases of PCLK 355 may be used to separate out the left acoustic channel data (signal CH_LEFT 356) and the right acoustic channel data (signal CH RIGHT 357) from the data bitstream input from the two PDM microphones (not shown) to the controller via PDAT input 341.

PDM clock generator 348 may generate the clock signal MAINCLK 350 from which all of the other clocks in controller 340 and the larger system may be derived. MAINCLK 350 may be delayed by delay element 374 to generate MCLK 349. Glitchless clock logic 370 may comprise flip/flops 371, 372, and 373 with their clock inputs coupled to MAINCLK 350 and their data inputs (D) coupled to the three main control signals EN_LEFT 353, EN_RIGHT 354, and CLKSEL 358, respectively. The data outputs (Q) of flip/flops 371, 372, and 373 may be coupled to the synchronous control signals ENL 361, ENR 362, and INTCLKSEL 363, respectively. This may simplify the timing of the various signals in controller 340.

Signal EN_LEFT 353 may be used to enable and disable the left acoustic channel PDM microphone (not shown). It may be synchronized with MAINCLK by flip/flop 371 to produce synchronous control signal ENL 361. Delay element 374 may be used so that ENL 361 and MCLK 349 may arrive at AND gate 344 substantially simultaneously to avoid any glitching on the PCLK0 331 signal. When ENL 361 is at logic-1, PCLK0 331 may be enabled, and MCLK 349 may be driven by PCLK0 output 342 onto the PCLK0 331 signal. When ENL 361 is at logic-0, PCLK0 331 may be disabled, and logic-0 may be driven by PCLK0 output 342 onto the PCLK0 331 signal.

Signal EN_RIGHT 354 may be used to enable and disable the right acoustic channel PDM microphone (not shown). It may be synchronized with MAINCLK by flip/flop 371 to produce synchronous control signal ENR 362. Delay element 374 may be used so that ENR 362 and MCLK 349 may arrive at AND gate 345 substantially simultaneously to avoid any glitching on the PCLK1 332 signal. When ENR 362 is at logic-1, PCLK1 332 may be enabled, and MCLK 349 may be driven by PCLK1 output 343 onto the PCLK1 332 signal. When ENR 362 is at logic-0, PCLK0 331 may be disabled, and logic-1 is driven by PCLK0 output 342 onto the PCLK0 331 signal.

Separately clocking the two PDM microphones (not shown) may allow the user the flexibility to power down either PDM microphone to save power while using the other PDM microphone to capture sound. By disabling each clock at a different logic level, each microphone may present high impedance to the PDAT signal 330 so as not to interfere with the other microphone when disabled. This would not be possible with the standard two-wire PDM interface.

Glitchless clock multiplexer 380 may be used to select the source of PCLK 355. If one microphone is going to be inactive, then the clock of the other microphone may be used to capture the acoustical data from the other microphone on the bitstream presented on PDAT 330. Glitchless clock multiplexer 380 may comprise a first data input coupled to INTPLCK0 351, a second data input coupled to INTPLCK0 351, and a clock select signal coupled to INTCLKSEL 363. Control signal CLKSEL 358 may be synchronized to MAINCLK 350 by flip/flop 373 to generate INTCLKSEL 363. Delay element 375 may be coupled between flip/flop 373 and glitchless clock multiplexer 380 to ensure proper timing between the signals INTPLCK0 351, INTPLCK1 352, and INTCLKSEL 363.

Figure 4A:
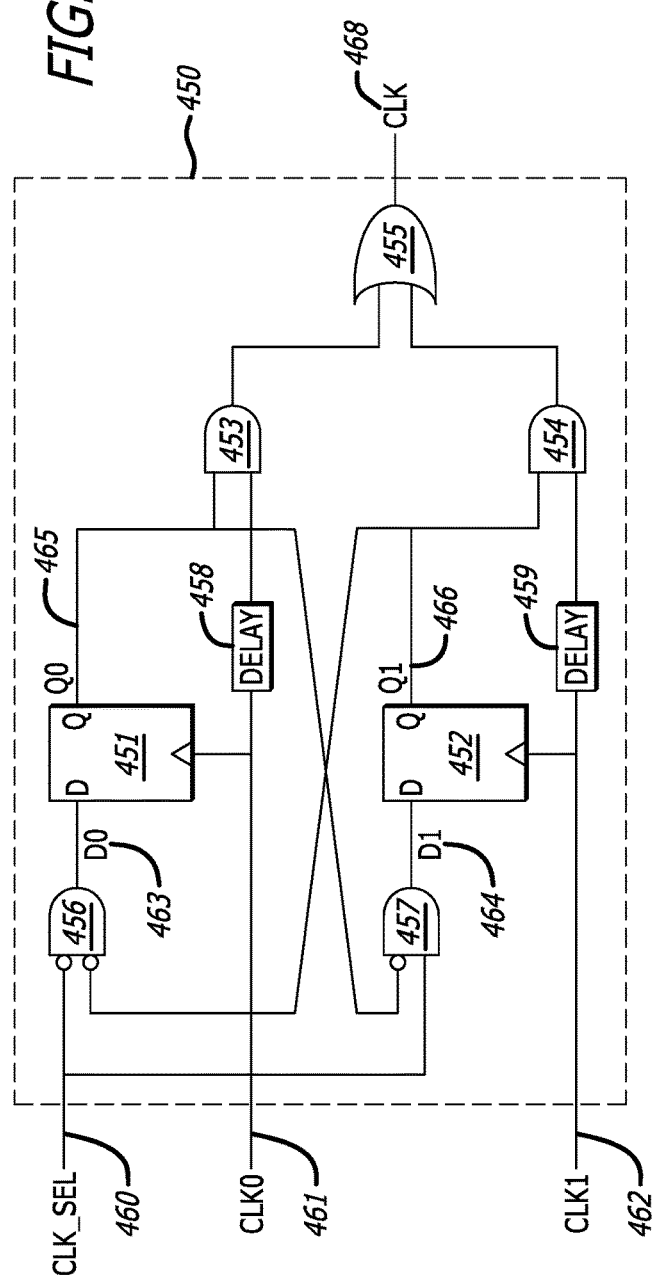
FIG. 4A is a schematic of a glitchless clock multiplexer in accordance with an embodiment of the disclosure.

Referring to FIG. 4A, a schematic of a glitchless clock multiplexer in accordance with an embodiment of the disclosure is shown. Glitchless clock multiplexer 450 may be thought of as an RS-latch (comprising AND gates 456 and 457) broken in two places by flip/flops 451 and 452 with an output multiplexer (comprising AND gates 453 and 454 and OR gate 455) selecting the active clock channel to output.

The multiplexer function may be glitchless because the two internal select signals Q0 465 and Q1 466 may never both be at logic-1 at the same time. Thus either AND gate 453 may be passing CLK0 461 through to OR gate 455 while CLK1 462 may be blocked at AND gate 454 (presenting a logic-0 to OR gate 455), allowing CLK1 462 to pass to the output CLK 468, or AND gate 454 may be passing CLK1 462 through to OR gate 455 while CLK0 461 may be blocked at AND gate 453 (presenting a logic-0 to OR gate 455) allowing CLK1 462 to pass to the output CLK 468.

The flip/flops 451 and 452 may hold the current selection state. For example, if the input CLK_SEL 460 has been in the logic-0 state for several clock cycles, the Q0 465 output of flip/flop 451 may be at logic-1 allowing CLK0 461 to pass through AND gate 453 as the active clock after some delay in delay element 458. Similarly, the Q1 466 output of flip/flop 452 may be at logic-0, blocking CLK1 462 from passing through AND gate 454. If the input CLK_SEL 460 has been in the logic-1 state for several clock cycles, the Q0 465 output of flip/flop 451 may be at logic-0 blocking CLK0 461 from passing through AND gate 453. Similarly, the Q1 466 output of flip/flop 452 may be at logic-1, allowing CLK1 462 to pass through AND gate 454 as the active clock after some delay in delay element 459.

During transitions from one active clock to another, the RS-latch structure may ensure that both Q0 465 and Q1 466 are at logic-0 for one clock cycle. For example, if CLK0 461 is currently the active clock, then CLK_SEL 460 may be at logic-0. This may force AND gate 457 to present a logic-0 to the D1 input of flip/flop 452. When clocked by CLK1 462, flip/flop 452 may force Q1 466 to logic-0, blocking CLK1 462 at AND gate 454. Q1 466 is inverted at one input of AND gate 456 and may present logic-1 to the AND function. CLK_SEL 460 at logic-0 may also be inverted at the input of AND gate 456 and present a logic-1 to the AND function. AND gate 456 may present a logic-1 to the D0 463 input to flip/flop 451. When clocked, flip/flop 451 may present a logic-1 to AND gates 453 and 457. Since the input of AND gate 457 that is coupled to Q0 465 is inverted, a logic-0 is presented to the AND function.

When CLK_SEL 460 switches from a logic-0 to a logic-1, it may present a logic-0 to the AND function of AND gate 456, which may drive D0 463 to logic-0. After the next rising edge of CLK0 461, Q0 465 may transition from logic-1 to logic-0, which may present a logic-0 to AND gate 453, blocking CLK0 461 from driving CLK 468. Because the Q1 466 signal is inverted at the input of AND gate 457, it may present a logic-0 to signal D1 464 despite CLK_SEL 460 being at logic-1. Thus, Q1 466 may remain at logic-0 for a clock cycle until the next rising edge of CLK1 462. Thus, for one clock cycle, both Q0 465 and Q1 466 may both be at logic-0, which may result in a missing clock pulse on CLK 468. When CLK_SEL 460 switches from a logic-1 to a logic-0, the circuit function is similar and may result in a missing clock pulse on CLK 468.

It is worth noting that the delay element 458 may be used to ensure that Q0 465 and CLK0 461 arrive at AND gate 453 at substantially the same time to avoid creating a glitch when CLK0 461 is being deselected. Similarly, the delay element 459 may be used to ensure that Q1 466 and CLK1 462 arrive at AND gate 454 at substantially the same time to avoid creating a glitch when CLK1 462 is being deselected.

Figure 4B:
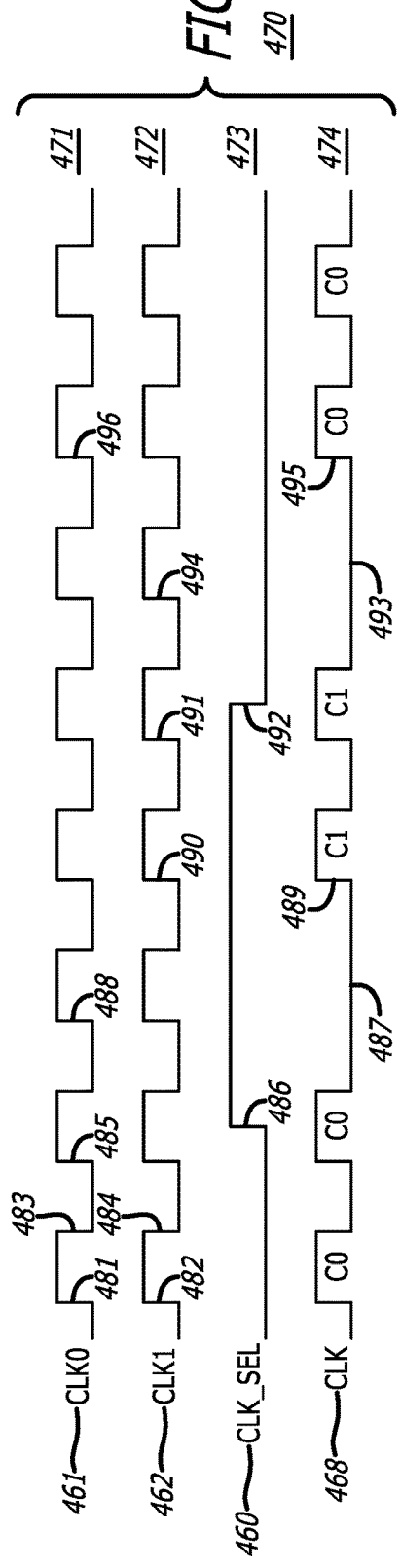
FIG. 4B is a waveform diagram of the operation of a glitchless clock multiplexer in accordance with an embodiment of the disclosure.

Referring to FIG. 4B, a waveform diagram of the operation of a glitchless clock multiplexer in accordance with an embodiment of the disclosure is shown. Waveform diagram 470 comprises four waveforms representing the external signals of the glitchless clock multiplexer 450 of FIG. 4A. Shown in the waveform diagram are waveform 471 of CLK0 461, waveform 472 of CLK1 462, waveform 473 of CLK_SEL 460, and waveform 474 of CLK 468. In some embodiments, CLK0 461 and CLK1 462 may correspond to the internal clocks INTPCLK0 351 and INTPCLK1 352 of FIG. 3, respectively. In some embodiments, CLK_SEL 460 may correspond to the internal control signal INTCLKSEL 363 of FIG. 3. In waveform 474, the designations C0 and C1 indicate that the clock pulse originated from CLK0 461 and CLK1 462, respectively.

In a dual PDM microphone application, CLK0 461 and CLK1 462 may have the same clock period, and the active edges may be substantially aligned since both may be derived from the same clock source (e.g., like MCLK 349 of FIG. 3). This can be seen in the waveforms 471 and 472, where rising edges 481 and 482 are substantially aligned, as are falling edges 483 and 484. In some embodiments, CLK_SEL 460 may be synchronized to the clocks CLK0 461 and CLK1 462. Initially, CLK_SEL 460 is at logic-0, and CLK0 461 is the active clock channel.

In an exemplary channel transition to CLK1 462 as the active clock, CLK_SEL 460 will transition to logic-1 at edge 486 in response to CLK0 461 edge 485. This causes there to be no clock pulse on CLK 468 at location 487 (corresponding to edge 488 on CLK0 461) as the glitchless clock multiplexer 450 blocks both clock channels for one clock cycle. This is a "missing" clock pulse described in conjunction with FIG. 4A above. CLK 468 becomes active again at edge 489, which is derived from edge 490 on CLK1 462.

In an exemplary channel transition back to CLK0 461 as the active clock, CLK_SEL 460 will transition to logic-0 at edge 492 in response to CLK1 462 edge 491. This causes there to be no clock pulse on CLK 468 at location 493 corresponding to edge 494 on CLK1 462 as the glitchless clock multiplexer 450 blocks both clock channels for one clock cycle. This is the "missing" clock pulse described in conjunction with FIG. 4A above. CLK 468 becomes active again at edge 495, which is derived from edge 496 on CLK0 461.

Persons skilled in the art will realize that there are many different implementations of a glitchless clock multiplexer and the embodiment of FIG. 4A and FIG. 4B is exemplary only and in no way limiting.

Figure 5:
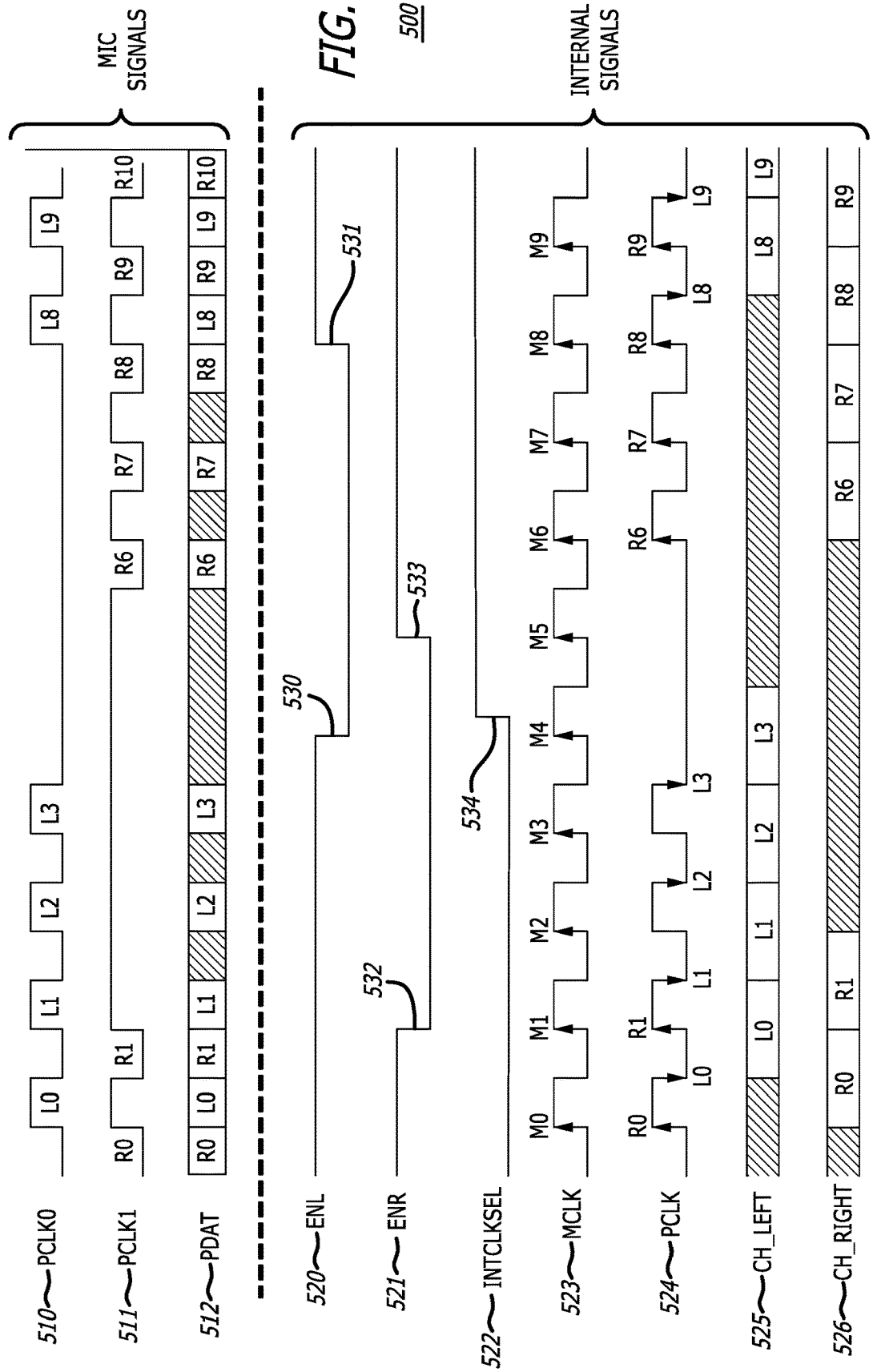
FIG. 5 is a waveform diagram of the operation of a system employing dual PDM microphones in accordance with an embodiment of the disclosure; and FIG. 6A

Referring to FIG. 5, a waveform diagram 500 of the operation of a system employing dual PDM microphones in accordance with an embodiment of the disclosure is shown. In the figure, three microphone (MIC) waveforms PCLK0 510, PCLK1 511, and PDAT 512 of the three-wire PDM interface are shown. These signals may correspond to the external signals PCLK0 331, PCLK1 332, and PDAT 330 described in conjunction with FIG. 3 above. PDAT may be a bitstream generated by both of the PDM microphones in response to PCLK0 510 and PCLK1 511. When PCLK0 is at logic-1, the left channel PDMDAT signal drive may PDAT 512, and left channel data (e.g., L0, L1, L2 . . . L9) may appear on PDAT 512. When PCLK0 is at logic-0, the left channel PDMDAT signal may present high-impedance to the PDAT 512 node. When PCLK1 is at logic-0, the right channel PDMDAT signal drive may PDAT 512, and right channel data (e.g., R0, R1, R2 . . . R10) may appear on PDAT 512. When PCLK1 is at logic-0, the right channel PDMDAT signal may present high-impedance to the PDAT 512 node.

Also present in the figure are waveforms ENL 520, ENR 521, INTCLKSEL 522, MCLK 523, PCLK 524, CH_LEFT 525, and CH RIGHT 526. These signals may correspond to the internal signals ENL 361, ENR 362, INTCLKSEL 363, MCLK 349, PCLK 355, CH_LEFT 356, and CH RIGHT 357 from FIG. 3, respectively.

MCLK 523 may be the master clock and may be the source for PCLK0 510, PCLK1 511, and PCLK 524. Ten MCLK 523 periods are shown, and each is labeled M0 through M9 at the active (rising) edge (indicated by the upward arrows). While MCLK 523 may be free-running, PCLK0 510 and PCLK1 511 may be disabled by signals ENL 520 and ENR 521, respectively. If both PCLK0 510 and PCLK1 511 are disabled, PCLK 512 may stop running. Thus there may be no PCLK 524 pulses corresponding to MCLK 523 pulses M4 and M5. Note that PCLK0 510 (if active) may be active on the half clock cycle following the active edge of MCLK 523, and PCLK1 511 (if active) may be active on the half clock cycle preceding the active edge of MCLK 523.

Either edge of PCLK 524 may be active. If PCLK0 510 is active, PCLK 524 may capture the data on PDAT 512 on the falling edge. This happens six times in the figure at L0, L1, L2, L3, L8, and L9. If PCLK0 510 is active, PCLK 524 will capture the data on PDAT 512 on the rising edge. This happens six times in the figure at R1, R2, R6, R7, R8, and R9. In theory, all edges on PCLK 524 are active edges, but only those capturing valid data are indicated with the active edge arrow designation for clarity. The left channel PDM data may be clocked into a flip/flop on the falling edges of PCLK 524 and may appear on the CH_LEFT 525 signal for further processing, while the right channel PDM data may be clocked into a flip/flop on the rising edges of PCLK 524 and may appear on the CH RIGHT 526 signal for further processing.

ENL 520 may be the control signal that enables (logic-1) and disables (logic-0) PCLK0 510. ENL 520 may start at logic-1, transition to logic-0 at edge 530, and then transitions back to logic-1 at edge 531. This may allow four clock pulses on PCLK0 510 originating from MCLK 523 pulses M0 through M3. Correspondingly, the data L0, L1, L2, and L3 may appear on PDAT 512 and are captured by flip/flops on the falling edges L0, L1, L2, and L3 of PCLK 524 as CH_LEFT 525. With ENL 520 at logic-0 for the time period corresponding to MCLK 523 pulses M4 through M7, no left channel data may appear on PDAT 512. After edge 531, PCLK0 510 may go active again, and left channel data L8 and L9 may appear on PDAT 512. Note that PCLK0 510 may be driven to logic-0 when disabled to disable the PDMDAT output of the left PDM microphone.

ENR 521 may be the control signal that enables (logic-1) and disables (logic-0) PCLK0 510. ENR 521 may start at logic-1, transition to logic-0 at edge 532, and then transition back to logic-1 at edge 533. This may allow two clock pulses on PCLK1 511 originating from MCLK 523 pulses M0 through M1. Correspondingly, the data R0 and R1 may appear on PDAT 512 and may be captured by flip/flops on edges R0 and R1 of PCLK 524 as CH RIGHT 526. With ENR at logic-0 for the time period corresponding to MCLK 523 pulses M2 through M5, no right channel data may appear on PDAT 512. After edge 533, PCLK1 511 may go active again and right channel data R6, R7, R8, R9, and R10 may appear on PDAT 512. Note that PCLK1 511 may be driven to logic-0 when disabled to disable the PDMDAT output of the right PDM microphone.

The signal INTCLKSEL 522 may start at logic-0 and transition to logic-1 at edge 534. The first four pulses in the figure on PCLK 524 may correspond to MCLK 523 pulses M0 to M3 via PCLK0 510. During the period when both PCLK0 510 and PCLK1 511 are inactive, INTCLKSEL 522 transitions to logic-1 at edge 534. The following four PCLK 524 pulses may correspond to MCLK 524 pulses M6 to M9 via PCLK1 511.

Figure 6A:
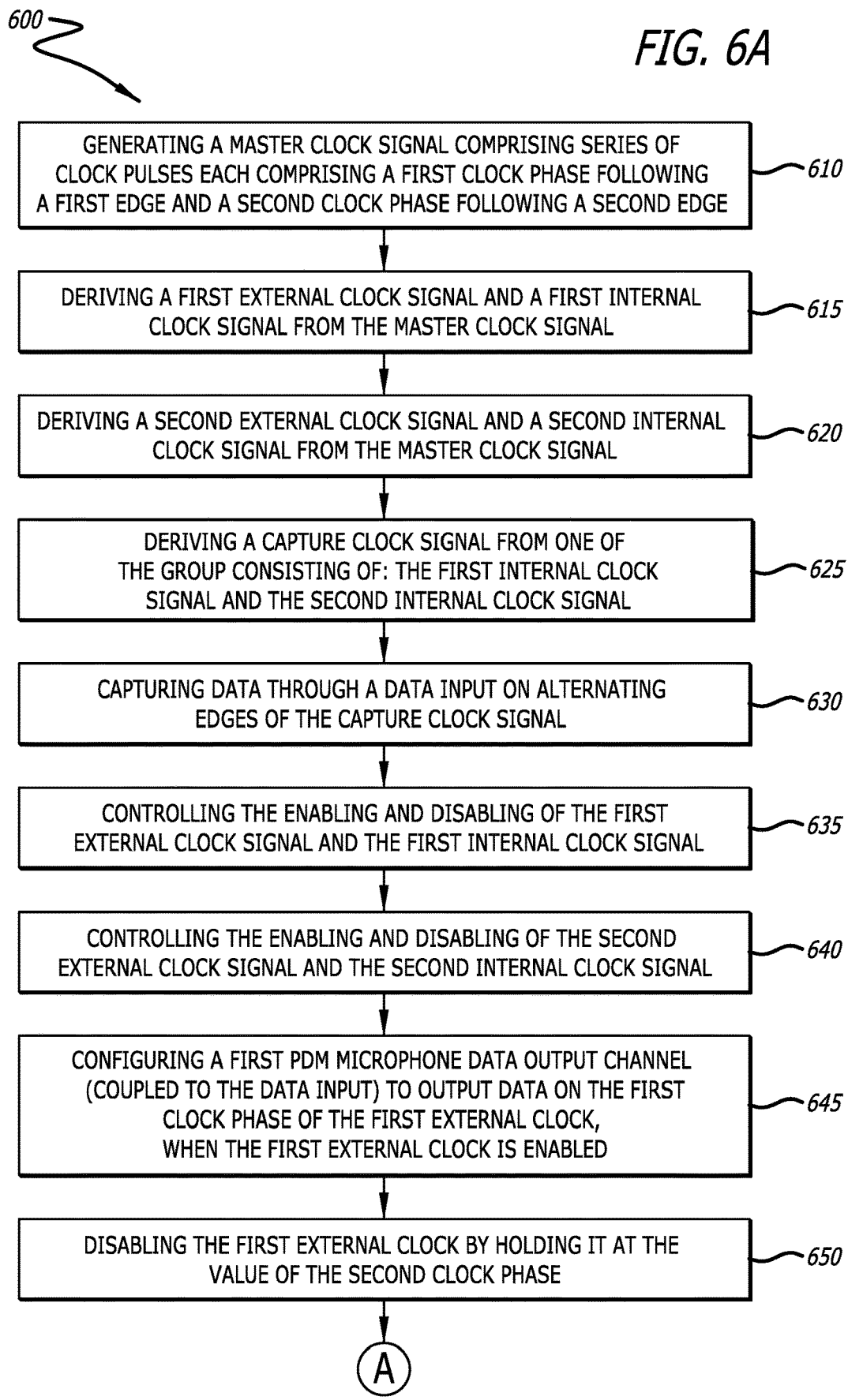
FIG. 6B is a flowchart depicting a process of operating a dual PDM microphone system in accordance with an embodiment of the disclosure.
Figure 6B:
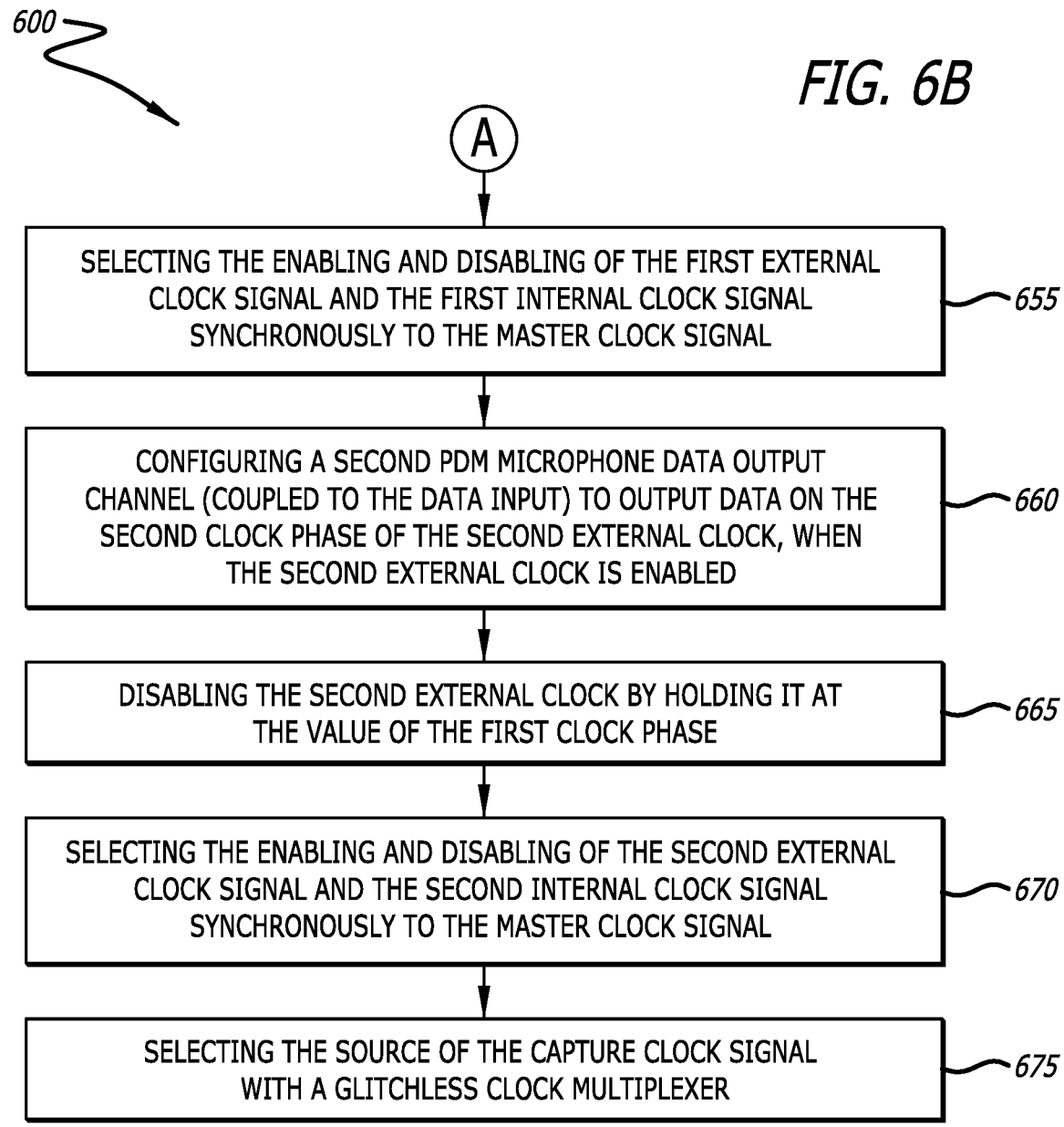

Referring to FIG. 6A and FIG. 6B, a flowchart depicting a process 600 of operating a dual PDM microphone system in accordance with an embodiment of the disclosure is shown. Process 600 may begin by generating a master clock signal (block 610). This signal may comprise a series of clock pulses having a first phase following a first active edge and a second phase following a second edge. The master clock signal may be used to generate a first external clock and a first internal clock (block 615). The master clock signal may also be used to generate a second external clock and a second internal clock (block 620). A capture clock may be derived from the first internal clock or the second internal clock (block 625). The capture clock may capture input data from a data input on both edges (block 630). The first external clock and the first internal clock may be enabled and disabled as controlled by a first control signal (block 635). The second external clock and the second internal clock may be enabled and disabled as controlled by a second control signal (block 640).

A first PDM microphone data output channel (coupled to the data input) is configured to output data on the first clock phase of the first external clock when the first external clock is enabled (block 645). When the first external clock is disabled, it is held at its value in the second clock phase (block 650). The enabling and disabling of the first external clock signal and the first internal clock signal may be selected synchronously with the master clock signal (block 655). A second PDM microphone data output channel (coupled to the data input) is configured to output data on the second clock phase of the second external clock when the second external clock is enabled (block 660). When the second external clock is disabled, it is held at its value in the first clock phase (block 665). The enabling and disabling of the second external clock signal and the second internal clock signal may be selected synchronously with the master clock signal (block 670). The source of the capture clock from the two internal clocks may be done by a glitchless clock multiplexer (block 675).

Information as herein shown and described in detail is fully capable of attaining the above-described object of the present disclosure, the presently preferred embodiment of the present disclosure, and is, thus, representative of the subject matter that is broadly contemplated by the present disclosure. The scope of the present disclosure fully encompasses other embodiments that might become obvious to those skilled in the art, and is to be limited, accordingly, by nothing other than the appended claims. Any reference to an element being made in the singular is not intended to mean "one and only one" unless explicitly so stated, but rather "one or more." All structural and functional equivalents to the elements of the above-described preferred embodiment and additional embodiments as regarded by those of ordinary skill in the art are hereby expressly incorporated by reference and are intended to be encompassed by the present claims.

Moreover, no requirement exists for a system or method to address each and every problem sought to be resolved by the present disclosure, for solutions to such problems to be encompassed by the present claims. Furthermore, no element, component, or method step in the present disclosure is intended to be dedicated to the public regardless of whether the element, component, or method step is explicitly recited in the claims. Various changes and modifications in form, material, work-piece, and fabrication material detail can be made, without departing from the spirit and scope of the present disclosure, as set forth in the appended claims, as might be apparent to those of ordinary skill in the art, are also encompassed by the present disclosure.

What is claimed is:

1. A method of operating a system comprising a controller, the method comprising:

generating a master clock signal comprising a series of clock pulses, each clock pulse comprising a first clock phase following a first clock edge and a second clock phase following a second clock edge;

deriving a first external clock signal and a first internal clock signal from the master clock signal;

deriving a second external clock signal and a second internal clock signal from the master clock signal;

deriving a capture clock signal from one of the group consisting of: the first internal clock signal and the second internal clock signal;

capturing data through a data input on alternating active edges of the capture clock signal;

controlling the enabling and disabling of the first external clock signal and the first internal clock signal; and controlling the enabling and disabling of the second external clock signal and the second internal clock signal.

2. The method of claim 1, wherein the system further comprises a first Pulse Density Modulation (PDM) microphone, wherein the first PDM microphone comprises:
a first data channel having a first clock input coupled to the first external clock signal, and
a first data output coupled to the data input and configured to be active during the first clock phases of the first external clock signal and inactive during the second clock phases of the first external clock signal when the first external clock signal is enabled.

3. The method of claim 2, wherein the system further comprises a second PDM microphone, wherein the second PDM microphone comprises:
a second data channel having a second clock input coupled to the second external clock signal, and
a second data output coupled to the data input and configured to be active during the second clock phases of the second external clock signal and inactive during the first clock phases of the second external clock signal when the second external clock signal is enabled.

4. The method of claim 3, wherein the first external clock signal and the second external clock signal are in phase such that, when both are active, the first clock phases of each overlap the first clock phases of the other, and the second clock phases of each overlap the second clock phases of the other.

5. The method of claim 4, further comprising configuring the first data channel to output data on the first clock phase of the first external clock when the first external clock is enabled.

6. The method of claim 5, further comprising disabling the first external clock by holding it at the value of the second clock phase.

7. The method of claim 6, further comprising selecting the enabling and disabling of the first external clock signal and the first internal clock signal wherein the selection is performed synchronously to the master clock signal.

8. The method of claim 4, further comprising configuring the second data channel to output data on the second clock phase of the second external clock when the second external clock is enabled.

9. The method of claim 8, further comprising disabling the second external clock by holding it at the value of the first clock phase.

10. The method of claim 9, further comprising selecting the enabling and disabling of the second external clock signal and the second internal clock signal, wherein the selection is performed synchronously to the master clock signal.

11. The method of claim 4, further comprising selecting the source of the capture clock signal with a glitchless clock multiplexer.

12. A device comprising:
a master clock generator;
a first clock channel;
a second clock channel;
a data input channel; and
a capture clock generator, wherein:
the master clock generator produces a master clock signal,
the first clock channel derives a first external clock signal and a first internal clock signal from the master clock signal when the first clock channel is enabled,
the second clock channel derives a second external clock signal and a second internal clock signal from the master clock signal when the second clock channel is enabled,
the capture clock signal generator derives a capture clock signal from one of the group consisting of: the first internal clock signal and the second internal clock signal,
the master clock signal, the first external clock signal, the first internal clock signal, the second external clock signal, the second internal clock signal, and the capture clock signal each comprises a series of clock pulses comprising first clock phases following first edges and second clock phases following second edges, and
the data input channel is configured to capture first data on the first active edges of the capture clock signal and to capture second data on the second active edges of the capture clock signal.

13. The device of claim 12, wherein the capture clock generator comprises a glitchless clock multiplexer having a first input coupled to the first internal clock signal, a second input coupled to the second internal clock signal, and an output coupled to the capture clock signal.

14. The device of claim 13, wherein the device is configured to control a first Pulse Density Modulation (PDM) microphone, wherein the first PDM microphone comprises:
a first data channel having a first clock input configured to be coupled to the first external clock signal, and
a first data output configured to be coupled to the data input channel and configured to be active during the first clock phases of the first external clock signal and inactive during the second clock phases of the first external clock signal when the first external clock signal is enabled.

15. The device of claim 14, wherein the device is configured to control a second PDM microphone, wherein the second PDM microphone comprises:
a second data channel having a second clock input configured to be coupled to the second external clock signal, and
a second data output configured to be coupled to the data input channel and configured to be active during the second clock phases of the second external clock signal and inactive during the first clock phases of the second external clock signal when the first external clock signal is enabled.

16. The device of claim 15, wherein:
the first external clock is disabled by holding it at the value of the second clock phase, and
the enabling and disabling of the first external clock signal is performed synchronously to the master clock signal.

17. The device of claim 16, wherein:
the second external clock is disabled by holding it at the value of the first clock phase, and
the enabling and disabling of the second external clock signal is performed synchronously to the master clock signal.

18. The device of claim 17, wherein:
the first PDM microphone further comprises a first select input, wherein:
the first data output is active upon the first phase of the first clock input when the first select input is at a first logic level, and
the first data output is active upon the second phase of the first clock input when the first select input is at a second logic level;

the second PDM microphone further comprises a second select input, wherein:
the second data output is active upon the first phase of the second clock input when the second select input is at the first logic level, and
the second data output is active upon the second phase of the second clock input when the second select input is at the second logic level;
the first select input is coupled to the first logic level; and
the second select input is coupled to the second logic level.

19. A system comprising:
a first Pulse Density Modulation (PDM) microphone comprising:
a first clock input, and
a first data output;
a second PDM microphone comprising:
a second clock input, and
a second data output; and
a PDM microphone controller comprising:
a first clock output signal coupled to the first clock input,
a second clock output signal coupled to the second clock input,
a data input coupled to the first data output and the second data output,
a master clock generator configured to produce a master clock signal comprising a series of clock pulses comprising first clock phases following first edges and second clock phases following second edges,
a first clock channel coupled to the first clock output, wherein:
the first clock output signal is a delayed version of the master clock signal when the first clock output signal is enabled, and the first clock output signal is driven to a first logic level when the first clock output signal is disabled, and
a first internal clock signal is a delayed version of the first clock output signal,
a second clock channel coupled to the second clock output, wherein:
the second clock output signal is a delayed version of the master clock signal when the second clock output signal is enabled, and the second clock output signal is driven to a second logic level when the second clock output signal is disabled, and
a second internal clock signal is a delayed version of the first clock output signal, and
a capture clock signal, wherein:
the capture clock signal is a delayed version of the first internal clock signal when a clock select signal is in a first state,
the capture clock signal is a delayed version of the second internal clock signal when a clock select signal is in a second state,
first input data from the data input is captured on a first edge of the capture clock signal, and
second input data from the data input is captured on a second edge of the capture clock signal.

20. The system of claim 19, wherein:
the first data output is configured to be active during the first clock phases of the first external clock signal and inactive during the second clock phases of the first external clock signal when the first external clock signal is enabled,
the second data output is configured to be active during the second clock phases of the second external clock signal and inactive during the first clock phases of the second external clock signal when the second external clock signal is enabled,
the capture clock selection is performed by a glitchless clock multiplexer,
the enabling and disabling of the first external clock signal is performed synchronously to the master clock signal, and
the enabling and disabling of the second external clock signal is performed synchronously to the master clock signal.

* * * * *